(12) United States Patent
Achard et al.

(10) Patent No.: US 12,404,684 B2
(45) Date of Patent: Sep. 2, 2025

(54) METHOD FOR INSTALLATION OF A CEILING SYSTEM

(71) Applicant: SAINT-GOBAIN ECOPHON AB, Hyllinge (SE)

(72) Inventors: Frederic Achard, Saint-Ouen (FR); Christopher Coat, Ecos (FR); Pierre Chigot, Helsingborg (SE)

(73) Assignee: SAINT-GOBAIN ECOPHON AB, Hyllinge (SE)

( * ) Notice: Subject to any disclaimer, the term of this patent is extended or adjusted under 35 U.S.C. 154(b) by 559 days.

(21) Appl. No.: 17/907,164

(22) PCT Filed: Mar. 30, 2021

(86) PCT No.: PCT/EP2021/058336
§ 371 (c)(1),
(2) Date: Sep. 23, 2022

(87) PCT Pub. No.: WO2021/198280
PCT Pub. Date: Oct. 7, 2021

(65) Prior Publication Data
US 2023/0106808 A1 Apr. 6, 2023

(30) Foreign Application Priority Data

Apr. 1, 2020 (EP) ..................................... 20167570

(51) Int. Cl.
*E04F 21/18* (2006.01)
*E04B 9/06* (2006.01)
(Continued)

(52) U.S. Cl.
CPC ............ *E04F 21/1883* (2013.01); *E04B 9/06* (2013.01); *G01C 15/006* (2013.01); *G06F 30/13* (2020.01)

(58) Field of Classification Search
CPC .......... E04B 1/00; E04B 9/06; E04F 21/1883; G01C 15/006; G06F 30/13
(Continued)

(56) References Cited

U.S. PATENT DOCUMENTS 3,775,929 A * 12/1973 Roodvoets .......... E04F 21/1838
33/286
8,936,367 B2 * 1/2015 Jung .................... H04N 9/3185
353/121
(Continued)

FOREIGN PATENT DOCUMENTS

GB 2 432 670 A 5/2007
WO WO 2019/229716 A1 12/2019

OTHER PUBLICATIONS

International Search Report issued Jun. 21, 2021 in PCT/EP2021/058336, filed on Mar. 30, 2021, 3 pages.
(Continued)

*Primary Examiner* — John E Breene
*Assistant Examiner* — Daniel M Quinn
(74) *Attorney, Agent, or Firm* — Oblon, McClelland, Maier & Neustadt, L.L.P.

(57) ABSTRACT

A method is for installing a ceiling system attached to a structural ceiling surface. The method includes illuminating, in sequence and by a projector, different subsets of a set of optical sensors separately arranged in a known distribution pattern on the structural ceiling surface. Each optical sensor of the set of optical sensors is arranged to output a temporal signal indicative of a level of illumination. The method also includes determining an image plane relative to the projector based on the known distribution pattern of the set of optical sensors and the outputted temporal signals of each of the
(Continued)

optical sensors, and displaying, by the projector, an image indicative of installation locations of the ceiling system at the image plane.

18 Claims, 9 Drawing Sheets

(51) Int. Cl.
  *G01C 15/00* (2006.01)
  *G06F 30/13* (2020.01)
(58) Field of Classification Search
  USPC .......................................................... 33/1 G
  See application file for complete search history.

(56) References Cited

U.S. PATENT DOCUMENTS

| | | | |
|---|---|---|---|
| 9,274,635 B2* | 3/2016 | Birnbaum | G06F 3/016 |
| 2005/0030486 A1* | 2/2005 | Lee | H04N 9/3185 |
| | | | 348/E17.005 |
| 2017/0275878 A1* | 9/2017 | Chigot | E04B 9/363 |
| 2023/0019423 A1* | 1/2023 | Nishita | G01C 15/008 |

OTHER PUBLICATIONS

Canadian Office Action issued Jun. 27, 2024 in Canadian Patent Application No. 3,172,053, 3 pages.

* cited by examiner

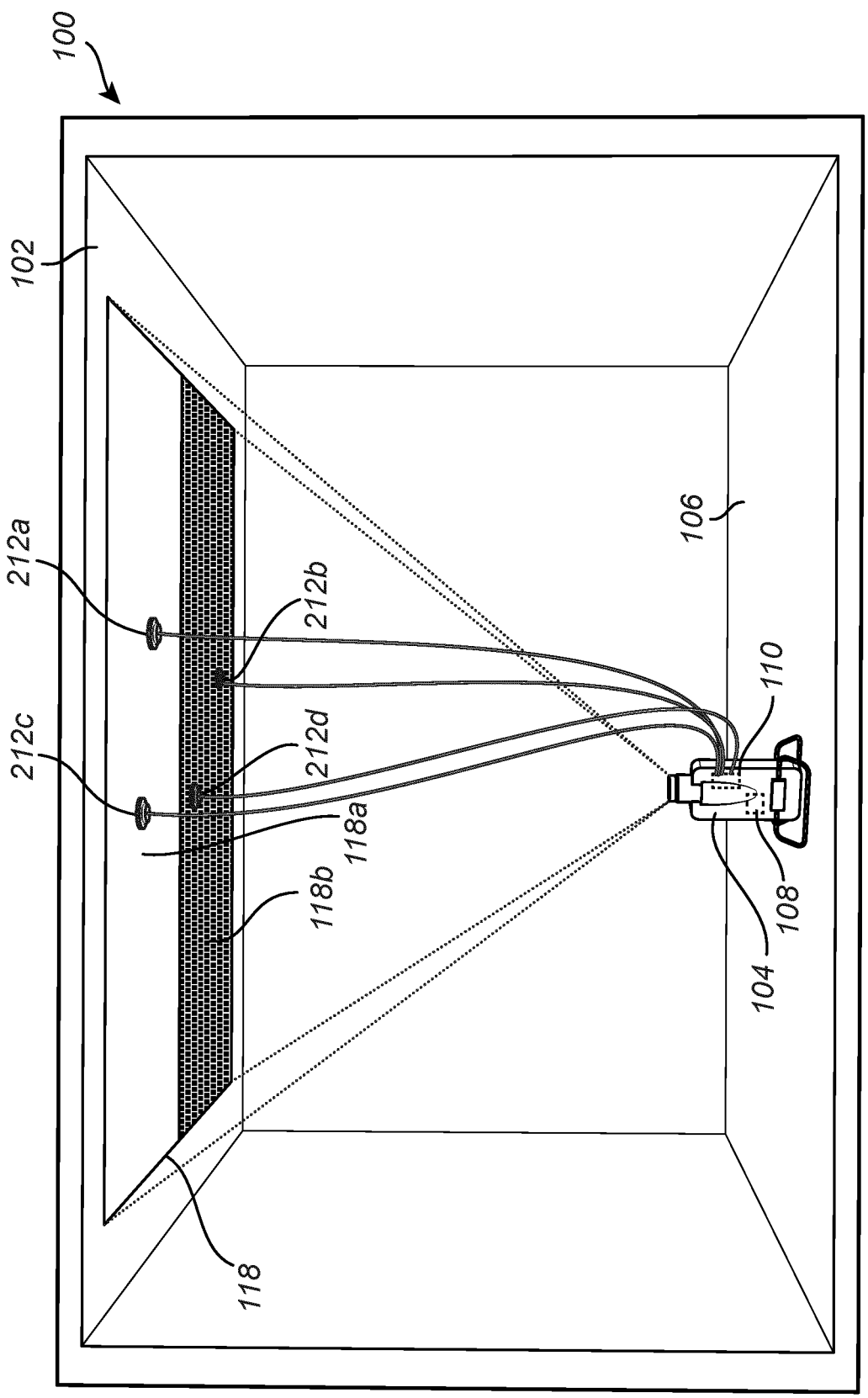

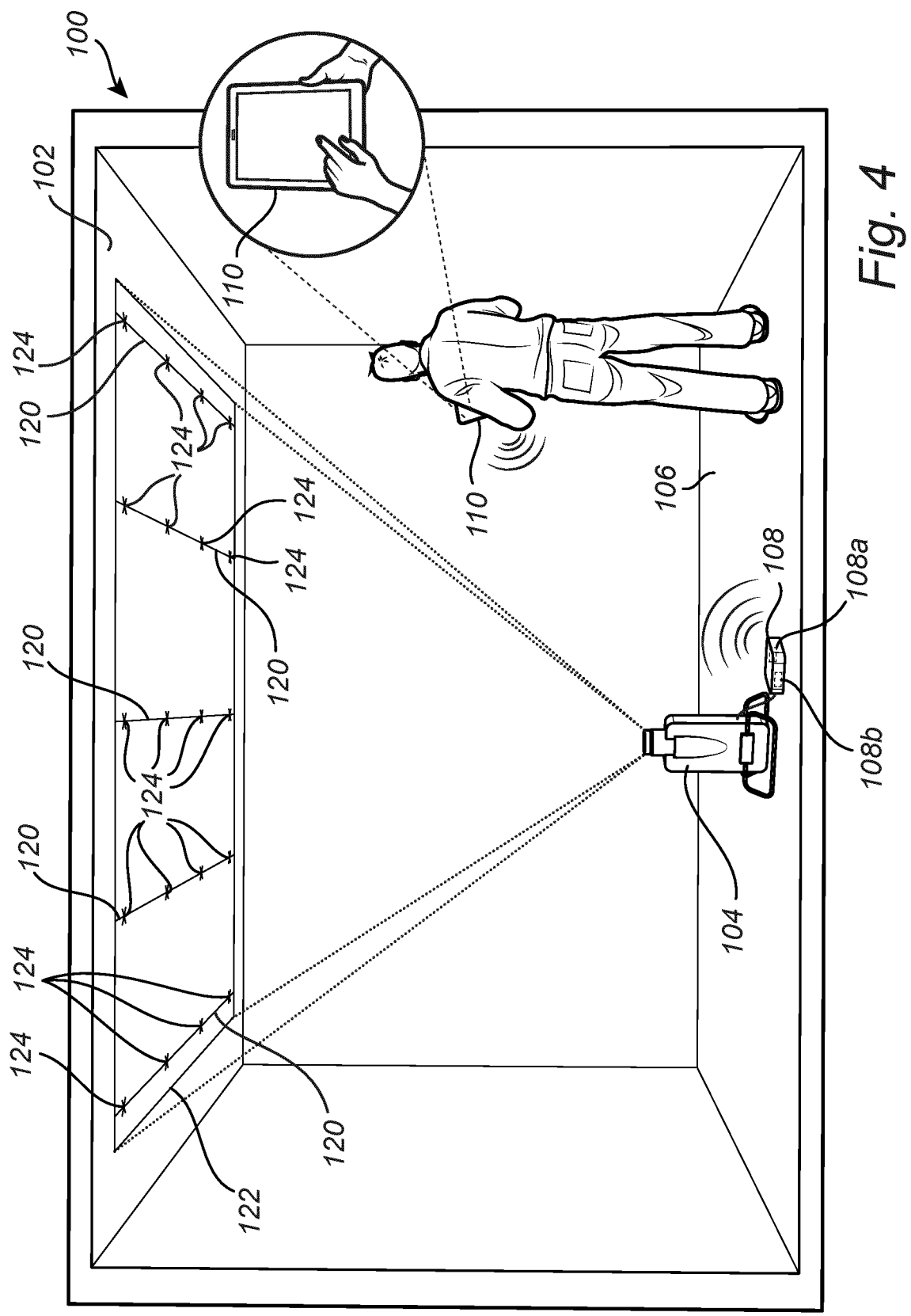

METHOD FOR INSTALLATION OF A CEILING SYSTEM

FILED OF THE INVENTION

The present invention generally relates to a method for installation of a ceiling system attached to a structural ceiling surface.

BACKGROUND OF THE INVENTION

A tile system in a room or in another accommodation may serve a variety of purposes. One purpose of having a tile system such as a suspended ceiling system or ceiling system attached to a structural ceiling may be to conceal an underside of a space, such as another room, which is located above the room. The tile system may hence be installed to improve the visual appearance of a room.

Another purpose may be to provide improved noise absorption and/or noise attenuation in and outside of the room by having a tile system including acoustic elements. The tiles then typically are acoustic elements and may comprise a mineral fibre material, such as glass wool.

A resulting plenum space located between a suspended ceiling and a structural ceiling of a room may further be utilized to accommodate e.g. wiring, piping, as well as devices related to heating, ventilation and air condition.

Moreover, acoustic elements may be used to improve the acoustical environment in a room while at the same time improve the visual appearance of the room.

The acoustic elements or tiles may be suspended form a surface in a room or may be attached to a surface in a room.

Moreover, the mounting of the tile system or ceiling system must be very precise since even a slight misalignment of the ceiling system or an acoustic element may have a big visual impact on the aesthetical appearance of the ceiling.

When the elements of the tile system or ceiling system are installed at oblique angles with respect to each other, it becomes even more difficult to precisely position and mount the elements of the ceiling system.

Thus, the positioning of the elements must be carefully measured. This work typically involves cumbersome work performed on ladders or scaffoldings and is prone to errors.

In one kind of a typical ceiling installation, a group of acoustic elements in form of tiles may by arranged in a grid of profiles. The profiles are typically attached to a surface in a room, such as a structural ceiling.

When installing acoustic elements, which are arranged in a grid of profiles, the installation process is time consuming and complex. The grid of profiles must be precisely attached to the surface of the room or else the acoustic elements will not properly fit in the grid.

Moreover, the mounting of the grid of profiles must be very precise since even a slight misalignment of the grid or an acoustic element may have a big visual impact on the aesthetical appearance of the ceiling.

When the profiles of the grid are installed at oblique angles with respect to each other, it becomes even more difficult to precisely position and mount the profiles of the grid.

Thus, the positioning of the profiles must be carefully measured. This work typically involves cumbersome work performed on ladders or scaffoldings and is prone to errors.

Moreover, when a tile system is installed over a large area, workers installing the tile system typically will have climb up and down on different ladders or scaffoldings in order to be able to reach the complete area of installation. This work is even more cumbersome and may put safety at risk.

SUMMARY OF THE INVENTION

In view of the above, it is an object of the present invention is to provide an improved method for installation of a ceiling system attached to a structural ceiling surface.

A further object is to provide such a method which is less complex and less prone to errors when installing a ceiling system.

It is also an object to provide a cost-effective method requiring less time and consequently less work labour for installing a ceiling system.

It is also an object to provide a more versatile method allowing a greater flexibility when it comes to installing a ceiling system.

To achieve at least one of the above objects and also other objects that will be evident from the following description, a method for installation of a ceiling system having the features defined in claim 1, is provided according to the present invention. Preferred embodiments will be evident from the dependent claims.

More specifically, there is provided according to the present invention a method for installation of a ceiling system attached to a structural ceiling surface, the method comprising; in sequence illuminating, by a projector, different sub sets of a set of optical sensors separately arranged in a known distribution pattern on the structural ceiling surface, wherein each optical sensor of the set of optical sensors being arranged to output a temporal signal indicative of a level of illumination, determining an image plane relative to the projector based on the known distribution pattern of the set of optical sensors and the outputted temporal signals of each of the optical sensors, and displaying, by the projector, an image indicative of installation locations of the ceiling system at the image plane.

Hereby an improved method for installation of a ceiling system is provided.

The method is for installation of a ceiling system attached to a structural ceiling surface.

The ceiling system may comprise a plurality of elements, such as ceiling tiles, absorber elements, acoustic elements, profiles or similar, so as to form a rectangular pattern. In other words, the plurality of elements may be arranged in a parallel manner.

The ceiling system may comprise a plurality of elements arranged at oblique angels with respect to each other so as to form an irregular pattern of elements. In other words, the plurality of elements may be arranged in a non-parallel manner. The method comprises, in sequence illuminating, by a projector, different sub sets of a set of optical sensors separately arranged in a known distribution pattern on the structural ceiling surface.

A set of optical sensors is therefore arranged on the structural ceiling surface. The sensors may be arranged directly on the structural ceiling surface or may be arranged indirectly for instance by being provided in a sensor housing which in turn is attached to the structural ceiling surface. The set of optical sensors are arranged in a known distribution pattern, meaning that the relative locations of the respective optical sensors are known. In other words, the mutual distances and the mutual directions of the respective optical sensors are known. The absolute locations of the optical sensors with respect to a reference location may additionally be known.

Different subsets of the of a set of optical sensors are illuminated by a projector in sequence. Hence, different combinations of optical sensors may be illuminated by a projector. A single optical sensor may be included in more than one subset of optical sensors. Also, a single optical sensor may be regarded a subset. The different subsets are illuminated in sequence, meaning that the respective subsets are illuminated consecutively in time after each other.

Different illumination sequences may be employed by the projector to illuminate the optical sensors in sequence. In practice, an illumination sequence may include a number of different illumination patterns employed by the projector in sequence. Each illumination pattern may then typically include a pattern of illuminated areas on the structural ceiling surface and consequently also include non-illuminated areas of the structural ceiling surface. The same subset may be illuminated more than once when conducting the method.

Each optical sensor of the set of optical sensors is arranged to output a temporal signal indicative of a level of illumination. Hence, each optical sensor is arranged to output a signal which varies in time with the illumination level detected by the optical sensor in question. The signal may be an analogue signal, a digital signal or a combination thereof. The signal level being outputted may be to scale with the illumination level detected by the optical sensor in question. The signal level being outputted may be subject to a mathematical transform applied to the illumination level detected by the optical sensor in question. The signal level being outputted may be subject to a threshold of the illumination level detected by the optical sensor in question, such that a signal is outputted or correspondingly interrupted when a detected illumination level exceeds a predetermined threshold value.

An image plane is determined relative to the projector based on the known distribution pattern of the set of optical sensors and the outputted temporal signals of each of the optical sensors. By illuminating subsets of the optical sensors in sequence with a series of known illumination patterns, it may be determined for which illumination patterns or pattern a specific optical sensor is illuminated. That is, a space angle range with respect to the projector may be established based on the illumination pattern at hand, where the illumination pattern includes an illuminated portion or portions being projected over a known space angle range. Hence, the optical sensor in question will output a temporal signal indicative of how the optical sensor is being illuminated during the illumination sequence. In a corresponding manner, all optical sensors will output a respective temporal signal indicative of how the respective optical sensors are illuminated during the illumination sequence.

By combing the outputted temporal signals of each of the optical sensors with the known distribution pattern an image plane relative to the projector may be determined. The image plane may thus be determined by mathematical calculations. For example, the image plane relative the projector may be determined using homography algorithms as is known in the art. As is known, homography typically refer to the homography matrix which is the transfer matrix of projective transforms. The homography matrix is a linear transformation from a 2D plane to another. In the present case homography inversion, i.e. inverting the homography matrix, may advantageously be employed in determining the image plane.

After having determined the image plane relative to the projector based on the known distribution pattern of the set of optical sensors and the outputted temporal signals of each of the optical sensors, an image indicative of installation locations of the ceiling system may be displayed by the projector at the determined image plane. In other words, the projector may display an image which is compensated so as to be displayed in a desired manner at the image plane. Hence, the image may be displayed such that installation locations of the ceiling system at the image plane are displayed in a desired manner corresponding to actual installation locations of the ceiling system at the image plane. This may be done by adjusting the input to the projector such that the image is projected with a correct scale at the image plane.

The image may include simple indications of installation locations of the ceiling system. The image may visualise the complete installation of the ceiling system to be installed including indications of installation locations of elements such as tiles or primary profiles. The image may thus visualise a complete installation of the ceiling system to installed including any tiles or absorber elements and indications of installation locations of primary profiles. The image may include additional information.

Next, elements of the ceiling system are typically attached to the structural ceiling surface in locations corresponding to the installation locations indicated in the displayed image. The elements may be attached directly to the structural ceiling surface or may be suspended below at a distance from the structural ceiling surface.

The ceiling system may comprise a grid of profiles comprising a plurality of primary profiles, and the act of displaying the image may comprise displaying information indicative of installation locations of the primary profiles at the image plane.

The grid of profiles may comprise a plurality of profiles arranged so as to form a rectangular grid of profiles. In other words, the plurality of profiles may be arranged in a parallel manner. A rectangular grid of profiles typically includes a plurality of rectangular spaces for accommodating ceiling tiles, absorber elements, acoustic elements or similar.

The grid of profiles may comprise a plurality of profiles arranged at oblique angels with respect to each other so as to form an irregular grid of profiles. In other words, the plurality of profiles may be arranged in a non-parallel manner. An irregular grid of profiles typically includes a plurality of irregular spaces of different sizes and shapes for accommodating ceiling tiles, absorber elements, acoustic elements or similar.

The individual profiles of the grid of profiles are typically straight profiles. The individual profiles of the grid of profiles may have bent or curved shape. The profiles may be made of metal, plastic or any other suitable sufficiently rigid material.

The grid of profiles typically comprises a plurality of primary profiles. The primary profiles typically extend in a non-interrupted manner along an installation of a ceiling system. The primary profiles may be formed of a plurality of detachable sections, jointly forming the primary profiles.

The primary profiles may be attached directly to a structural ceiling surface or may be suspended below at a distance from the structural ceiling surface as is known in the art.

The primary profiles are typically interconnected by cross runners or cross profiles. By utilizing cross runners interconnecting the plurality of main runners the main runners may be stabilized and less prone to run in an undesired curved fashion.

Moreover there may be provided, a method for installation of a grid of profiles of a ceiling system attached to a structural ceiling surface, wherein the grid of profiles comprises a plurality of primary profiles, the method comprising; in sequence illuminating, by a projector, different sub sets of a set of optical sensors separately arranged in a known distribution pattern on the structural ceiling surface, wherein each optical sensor of the set of optical sensors being arranged to output a temporal signal indicative of a level of illumination, determining an image plane relative to the projector based on the known distribution pattern of the set of optical sensors and the outputted temporal signals of each of the optical sensors, and displaying, by the projector, an image indicative of installation locations of the primary profiles at the image plane.

Hereby an improved method for installation of a grid of profiles of a ceiling system may be provided.

The act of determining the image plane may comprise determining the image plane such that the image plane substantially includes physical locations of the optical sensors of the set of optical sensors. By determining the image plane such that the image plane substantially includes physical locations of the optical sensors of the set of optical sensors, the image plan may be determined such that it substantially coincides with the structural ceiling surface on which the set of optical sensors is arranged.

The act of displaying the image may comprise displaying the image on the structural ceiling surface. Hence, the image displayed at the image plane may thus be displayed at the structural ceiling surface in a desired manner such that installation locations of the ceiling system at structural ceiling surface are displayed in a desired manner corresponding to actual installation locations of the elements of the ceiling system at the structural ceiling surface.

The act of displaying the image may comprise calculating a projective transform based on a location of the projector relative to the image plane, and applying the projective transform to the image such that the displayed image is compensated for size and wrap with respect to the structural ceiling surface. The image transform may be calculated using a homography algorithm, as discussed above, and the image transform may then be applied to the image such that the image is compensated for size and wrap with respect to the structural ceiling surface. More specifically, homography inversion, i.e. inverting the homography matrix, may advantageously be employed in determining the projective transform.

In practice, the image transform may be applied to the image by adjusting the input to the projector accordingly. Hence, the projector may display an image which is compensated for size and wrap with respect to the structural ceiling surface so as to display the image in a desired manner at the structural ceiling surface. Hence, the image may be displayed such that installation locations of the elements of the ceiling system at the image plane are displayed in a desired manner corresponding to actual installation locations of the elements of the ceiling system at the structural ceiling surface.

The act of determining the image plane may comprise determining a rotation of the projector relative to a desired direction of the installation locations of the ceiling system at the image plane based on the known distribution pattern of the set of optical sensors and the outputted temporal signals of each of the optical sensors, and wherein the act of displaying the image comprises compensating a rotation of the image based on the determined rotation. The image rotation may be calculated using a homography algorithm and a rotation compensation may then be applied to the image such that the image is compensated for rotation with respect to the structural ceiling surface. More specifically, homography inversion, i.e. inverting the homography matrix, may advantageously be employed in determining the rotation of the projector relative to a desired direction of e.g. installation locations of primary profiles at the image plane based.

In practice, the rotation compensation may be applied to the image by adjusting the input to the projector accordingly. Hence, the projector may display an image which is compensated for size and wrap with respect to the structural ceiling surface so as to display the image in a desired manner at the structural ceiling surface. Hence, the image may be displayed such that installation locations of the elements of the ceiling system, such as primary profiles, at the image plane are displayed in a desired manner corresponding to actual installation locations of the elements of the ceiling system at the structural ceiling surface.

The act of displaying the image may comprise adjusting a position of the image at the image plane based on building information model data, BIM data. By adjusting a position of the image at the image plane based on building information model data, BIM data, the position of the image may be adjusted such that the installation locations of the elements of the ceiling system are aligned with certain building features, such as walls or air outlets. Correspondingly, the position of the image may be adjusted such that installation locations of e.g. primary profiles are positioned at locations where there is a reduced risk of interfering with or damaging concealed features of the building, such as piping or electrical cables.

The act of displaying the image may comprise adjusting a position of the image at the image plane based on a user-initiated input signal, which is advantageous in that a user may adjust the position of the image in a simple manner.

The optical sensors of the set of optical sensors may be arranged at locations corresponding to junctions of the grid of profiles. By arranging the optical sensors of the set of optical sensors at locations corresponding to junctions of the grid of profiles, a person installing the grid of profiles may get a visual confirmation that the image is displayed correctly. Hence, a person installing the grid of profiles may easily verify that the junctions of the grid of profiles are displayed at locations where the optical sensors are located at the structural ceiling surface. In this way, a person installing the grid of profiles may also verify that the image plane has been correctly determined or else the junctions of the grid of profiles may incorrectly be displayed at locations where the optical sensors are not located.

The optical sensors of the set of optical sensors may be arranged on a common substrate which is adapted to be arranged at the structural ceiling surface. By arranging the optical sensors of the set of optical sensors on a common substrate which is adapted to be arranged at the structural ceiling surface, the distribution pattern of the set of optical sensors may be kept constant and fixed in a secure manner. Moreover, the distribution pattern of the set of optical sensors may not need to be measured or considered by a person installing the ceiling system since the distribution pattern of the set of optical sensors may be fixed by the common substrate. Hence, the mutual distances and directions between the optical sensors of the set of optical sensors may be fixed and thus well known. Also, the method may become more efficient since a person installing the ceiling system may not have to spend time on installing a plurality of individual optical sensors.

The act of displaying the image may comprise displaying installation guidance based on building information model data, BIM data, which is advantageous in that installation guidance may be displayed while taking features of the building into account.

The act of displaying the image may comprise displaying fix points of the ceiling system to be installed, which is advantageous in that fix points may be displayed at locations where there is a reduced risk of interfering with or damaging concealed features of the building, such as piping or electrical cables. Hence, a person installing the ceiling system may get a visual guidance regarding where to safely fix the elements of the ceiling system.

The act of displaying the image may comprise displaying forbidden areas for fix points of the ceiling system to be installed, which is advantageous in that areas where fix points would risk interfering with or damaging concealed features of the building, such as piping or electrical cables, may be highlighted to a person installing the ceiling system. Hence, a person installing the ceiling system may get a visual guidance regarding where to not fix the elements of the ceiling system.

The act of displaying the image may comprise displaying fix points of primary profiles to be installed, which is advantageous in that fix points may be displayed at locations where there is a reduced risk of interfering with or damaging concealed features of the building, such as piping or electrical cables. Hence, a person installing the grid of profiles may get a visual guidance regarding where to safely fix the grid of profiles.

The act of displaying the image may comprise displaying forbidden areas for fix points of primary profiles to be installed, which is advantageous in that areas where fix points would risk interfering with or damaging concealed features of the building, such as piping or electrical cables, may be highlighted to a person installing the grid of profiles. Hence, a person installing the grid of profiles may get a visual guidance regarding where to not fix the grid of profiles.

The act of displaying the image may further comprise displaying building information model data, BIM data, which is advantageous in that concealed features of the building, such as piping or electrical cables, may be displayed to a person installing the ceiling system. Also, features of the building, such as piping or electrical cables, that has not yet been installed may be displayed to a person installing the ceiling system. In this way a person installing the ceiling system may account for features to be installed and hence save enough room for the features to be installed.

The act of in sequence illuminating different sub sets of the set of optical sensors may comprise; in sequence illuminating different sub sets of the set of optical sensors according to a first predetermined dichotomy pattern along a first major direction, and in sequence illuminating different sub sets of the set of optical sensors according to a second predetermined dichotomy pattern along a second major direction, the first major direction being perpendicular to the second major direction, which is advantageous in that the an accurate space angle range or space angle for each optical sensor with respect to the projector may be determined. In other words, the direction along which imaginary beam of the projector each optical sensor is located may be determined. By illuminating different sub sets of the set of optical sensors according along a first major direction and a second major direction, where the first major direction being perpendicular to the second major direction, the space angle range or space angle for each optical sensor with respect to the projector may be determined in series for the first major direction and the second major direction respectively.

The method may further comprise, arranging a second projector, separate from the projector, at a distance from the structural ceiling surface, and displaying, by the projector and the second projector, the image indicative of installation locations of the ceiling system at the image plane. By utilizing a projector and a second projector to jointly display the image indicative of installation locations of the ceiling system, such as elements and primary profiles, at the image plane, several advantages are achieved. For instance, an increased display area or installation area may be covered. Further, an increased redundancy may be achieved in case of failure of the projector or the second projector. Furthermore, the risk of certain areas of the image plane being shadowed, by for instance pillars, light armatures, inner walls or similar, may be reduced.

Further features of, and advantages with, the present inventive concept will become apparent when studying the appended claims and the following description. The skilled person will realize that different features of the present inventive concept may be combined to create variants other than those described in the following, without departing from the scope of the present inventive concept.

BRIEF DESCRIPTION OF THE DRAWINGS

The aspects of the inventive concept, including its particular features and advantages, will be readily understood from the following detailed description and the accompanying drawings, in which:

FIG. 2 conceptually illustrates the room of FIG. 1 with a different sensor setup as compared to FIG. 1.

FIG. 4 conceptually illustrates the room of FIG. 1 at a later stage of the method where installation locations of primary profiles of the grid of profiles are displayed at a structural ceiling surface.

DETAILED DESCRIPTION

Figure 1:
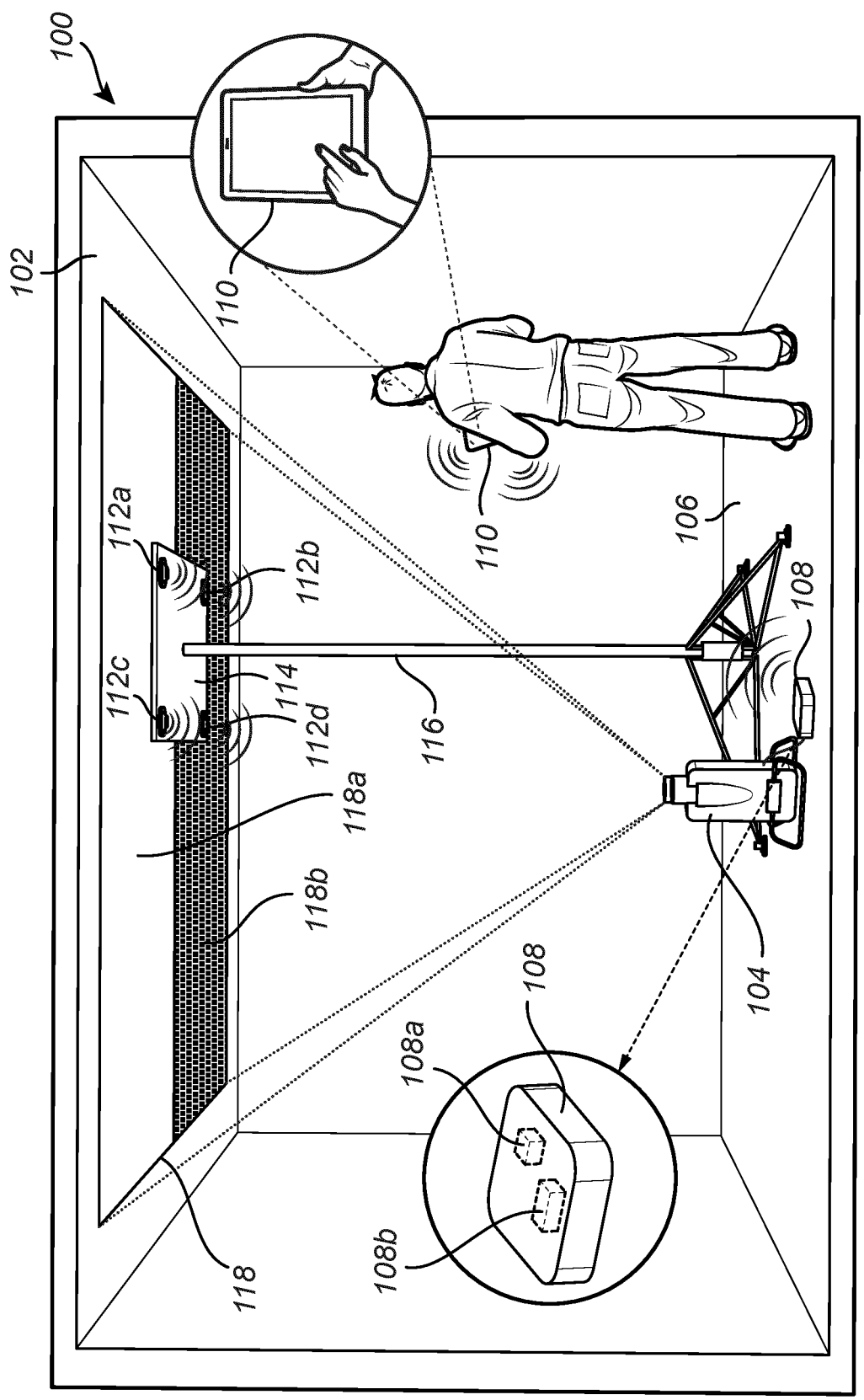
FIG. 1 conceptually illustrates a room in which a ceiling system including a grid of profiles is to be installed using a method for installation of a ceiling system.

The present inventive concept will now be described more fully hereinafter with reference to the accompanying drawings, in which preferred variants of the inventive concept are shown and discussed. This inventive concept may, however, be embodied in many different forms and should not be construed as limited to the variants set forth herein; rather, these variants are provided for thoroughness and completeness, and fully convey the scope of the inventive concept to the skilled person. Like reference numerals refer to like elements throughout the description.

As have been described above, the present inventive concept generally relates to installation of ceiling systems attached to structural ceiling surfaces. Hence, installations of any type of ceiling systems are encompassed by the present inventive concept. In the following description, the present inventive concept it will be described in conjunction with ceiling systems including a grid of profiles. However, the present inventive concept is equally applicable for with ceiling systems void of any grid of profiles.

FIG. 1 conceptually illustrates a room 100 in which a grid of profiles is to be installed using a method for installation of a grid of profiles of a ceiling system. A number of components used for executing the method will be described below in conjunction with describing the method. The method will be described sequentially below, and variants thereof will be discussed in-line. The components used for executing the method will sometimes be collectively referred to as a system.

More specifically, a grid of profiles of a ceiling system is to be attached to the structural ceiling surface 102 of the room 100. The grid of profiles to be installed comprises a plurality of primary profiles. The primary profiles are typically extending in a non-interrupted manner along an installation of a ceiling system. The method described for installation of a grid of profiles of a ceiling system includes displaying an image indicative of installation locations of the primary profiles. Primary profiles are thereafter typically attached to the structural ceiling surface 102 in locations corresponding to the installation locations indicated in the displayed image.

In the room 100 there is provided a projector 104. The projector 104 forming part of the system used for executing the method. The projector 104 is arranged on the floor 106 of the room 100. The projector 104 may alternatively be arranged on a wall or at the ceiling of the room 100. The projector 104 may be of any suitable kind. Examples of suitable projectors 104 include SD, HD and 4 K video projectors or beamers. Projectors 104 capable of displaying colour images are preferred while projectors 104 capable of displaying black and white images or monochromic images will suffice. Also, a laser projector 104 may be used to advantage. The projector 104 is connected to an image source 108. The image source 108 may be any device capable of providing an image signal to the projector 104. Examples of suitable image sources includes, computers, laptops, tablets and media players such an Apple TV® to give a few non-limiting examples. The image source 108 may be connected to the projector 104 by a wired connection, a wireless connection or a combination thereof. In the depicted system, the image source 108 is connected by wired connection to the projector 104.

The image source 108 includes a processor 108a capable of processing and altering image data. The processor 108a is typically capable of processing an incoming image signal in order to feed out an image signal suitable for the projector 104 in question. Alternatively, or additionally, the image source 108 may include a memory 108b having stored thereon image data used to produce an image signal for suitable for the projector 104 in question. The processor 108a may alter or manipulate the image data so as to alter or manipulate the image displayed by the projector 104.

The image source 108 is preferably attached to the projector 104 so as to form a single unit. The image source 108 may be integral to the projector 104. The image source 108 may be separate the projector 104.

The depicted system used for executing the method further includes a user device 110. The user device 110 may be connected to the image source 108 by a wired connection, a wireless connection or a combination thereof. The depicted user device 110 is a handheld device which is connected to the image source 108 by a wireless connection. The user device 110 may be any suitable device such as computers, laptops, media players and tablets such as an iPad® to give a few non-limiting examples. The user device 110 is arranged to transmit an image signal to the image source 108 or to transmit data relevant for the image source 108 to produce an image signal for the projector 104. The user device is typically capable of receiving different types of input form a user. The input may be input related to image adjustment, image manipulation, sensor locations, mutual distances, mutual directions, brightness, contrast, amount of image information, etc.

The user device 110 and the image source 108 may be the same device.

The depicted system used for executing the method further includes a set of optical sensors including four optical sensors 112a-d. The optical sensors 112a-d are arranged on the structural ceiling surface 102 of the room 100. More specifically, the optical sensors 112a-d are arranged on a common substrate 114. Hence, the optical sensors 112a-d are arranged indirectly on the structural ceiling surface 102 of the room 100. The common substrate 114 is adapted to be arranged on the structural ceiling surface 102. The common substrate 114 may for example be a board of thin material, a plate or similar. The common substrate 114 may be foldable and may for that purpose include hinges, fold lines or similar. By the common substrate 114 the optical sensors 112a-d are separately arranged in a known distribution pattern on the common substrate 114 and hence on the structural ceiling surface 102. In other words, the mutual distances and mutual directions between the respective optical sensors 112a-d are fixed by the common substrate 114 and hence the distribution pattern in known. The common substrate 114 is held at the structural ceiling surface 102 by means of a holder 116 in form of an adjustable tripod.

In FIG. 1 four optical sensors 112a-d are depicted. However, more optical sensors may be used, such as 5, 7, 10 or 50 optical sensors. By using more optical sensors, an increased accuracy may be achieved. However, in the following a system having four optical sensors 112a-d will be described.

Each of the four optical sensors 112a-d are connected to the user device 110 by means of a wireless connection. Each optical sensor 112a-d of the set of optical sensors being arranged to output a temporal signal indicative of a level of illumination. In other words, each optical sensor 112a-d is arranged to output a time sequential signal which is dependent on a level of illumination impinging on the optical sensor 112a-112d in question. The temporal signal indicative of a level of illumination will be discussed in greater detail below when referring to FIG. 3.

As an alternative, each optical sensor 112a-d of the set of optical sensors may be attached by a respective wired connection to a common wireless transmitter. The wireless transmitter may in turn be connected to the user device 110 by means of a wireless connection. The wireless transmitter may in this case advantageously be arranged on the common substrate 114.

As a further alternative, each optical sensor 112a-d of the set of optical sensors may be attached by a respective wired connection to a common wireless transmitter. The wireless transmitter may in turn be connected to the projector 104 by means of a wireless connection. The wireless transmitter may in this case advantageously be arranged on the common substrate 114.

As can be seen in FIG. 1, the projector 104 illuminates a portion 118 of the structural ceiling surface 102 of the room 100. The depicted illuminated portion 118 covers a major portion of the structural ceiling surface 102 of the room 100. As depicted in FIG. 1, the illuminated portion 118 of the structural ceiling surface 102 includes a bright area 118a with high illumination intensity and a less bright area 118b with a lower illumination intensity. The optical sensors 112a and 112c are present in the bright area 118a with high illumination intensity whereas the sensors 112b and 112d are present in the less bright area 118b with a lower illumination intensity. Hence, in the depicted moment of FIG. 1, optical sensors 112a and 112c will output a respective signal indicative of a higher level of illumination as compared to optical sensors 112b and 112d. Signals outputted by the optical sensors 112a-112d will be discussed in greater detail below when referring to FIG. 3.

Now referring to FIG. 2, here room 100 is depicted with a different setup of optical sensors 212a-212d. In order to avoid undue repetition, only differences in relation to FIG. 1 will be discussed below.

The optical sensors 212-a-d are arranged on the structural ceiling surface 102 of the room 100. More specifically, the optical sensors 212a-d are arranged directly on the structural ceiling surface 102 of the room 100. The respective optical sensors 212a-d may for instance be glued to or screwed to the structural ceiling surface 102 of the room 100. The optical sensors 212a-d are separately arranged on the structural ceiling surface 103. In other words, the mutual distances and directions between the respective optical sensors 212a-d are fixed by the optical sensors 212a-d being arranged on the structural ceiling surface 103. However, in this case, the distribution pattern will not directly be known per se. This means that a user executing the method will have to carefully determine the mutual distances and directions between the respective optical sensors 112a-d after the optical sensors 212a-d have been arranged on the structural ceiling surface 103, or the user executing the method will have to carefully arrange the optical sensors 212a-d on the structural ceiling surface 102 according to a predetermined known distribution pattern. Hence, the distribution pattern of the optical sensors 212a-d may be known either from measurements of the actual locations or from the fact that the optical sensors 212a-d are mounted according to a known distribution pattern.

The optical sensors 212a-d are connected to the projector 104 by respective wired connections. The projector 104 of FIG. 2 includes a user deice 110 and an image source 108 integrally formed with the projector 104. The user device 110 and an image source 108 fulfil corresponding purposes of those described in conjunction with FIG. 1 and will not be described in greater detail here.

Now referring to FIGS. 3a-3i. According to the method, different sub sets of the set of optical sensors 112a-112d (or 212a-d) are illuminated in sequence by the projector 104.

In FIGS. 3a-3i it is schematically depicted how two optical sensors denoted S1, S2, corresponding to any of the optical sensors 112a-112d (or 212a-d), are illuminated in sequence by the projector 104. If FIG. 3a-3i two sensors S1, S2 are depicted for reasons of simplicity. The same principle does however apply to the situation where more optical sensors are used. In FIG. 3a-3i, different subsets of the optical sensors S1 and S2 are illuminated in sequence by an illumination sequence including six different illumination patterns as depicted in FIGS. 3a-3f. The different subsets are corresponding to the actual optical sensors S1, S2 being illuminated at a certain point in time.

Figure 3A:
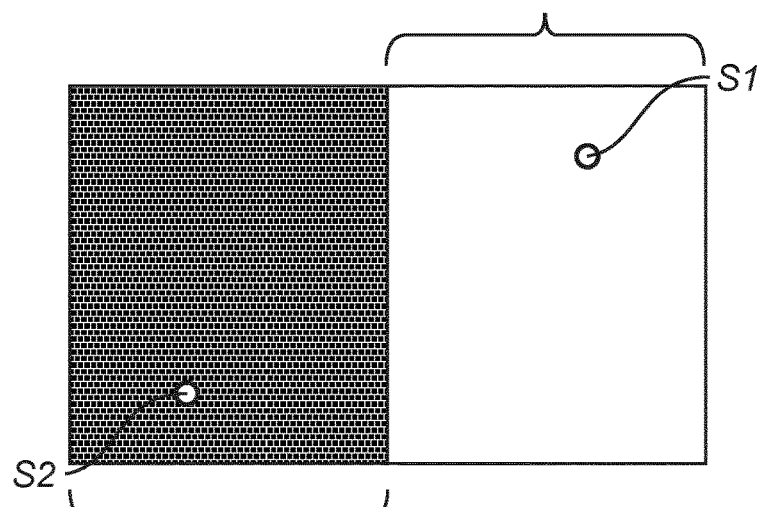
FIGS. 3a-3i schematically illustrates an illumination sequence and temporal signals form two different sensors.
Figure 3B:
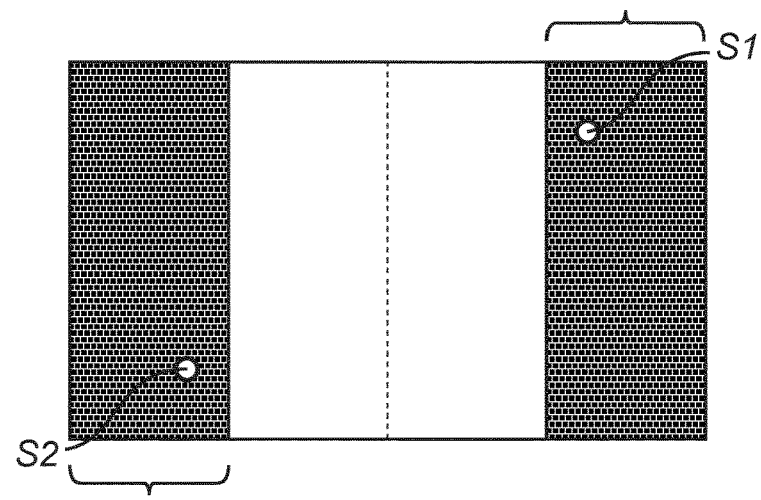
Figure 3C:
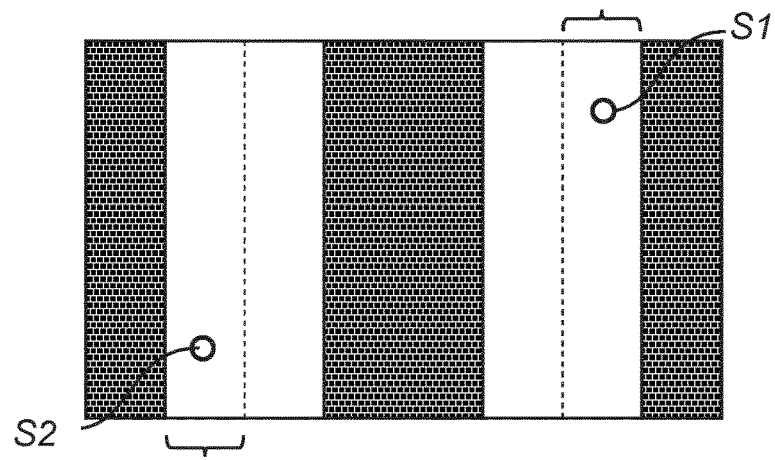
Figure 3D:
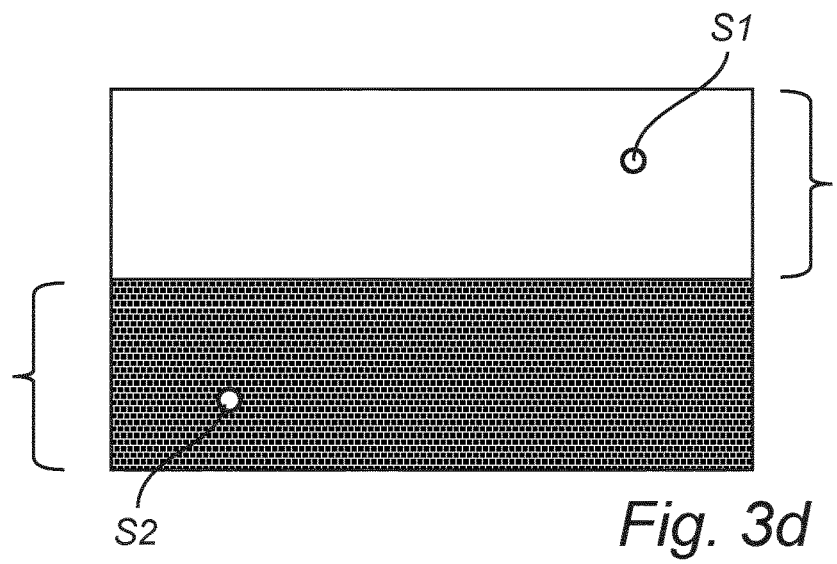
Figure 3E:
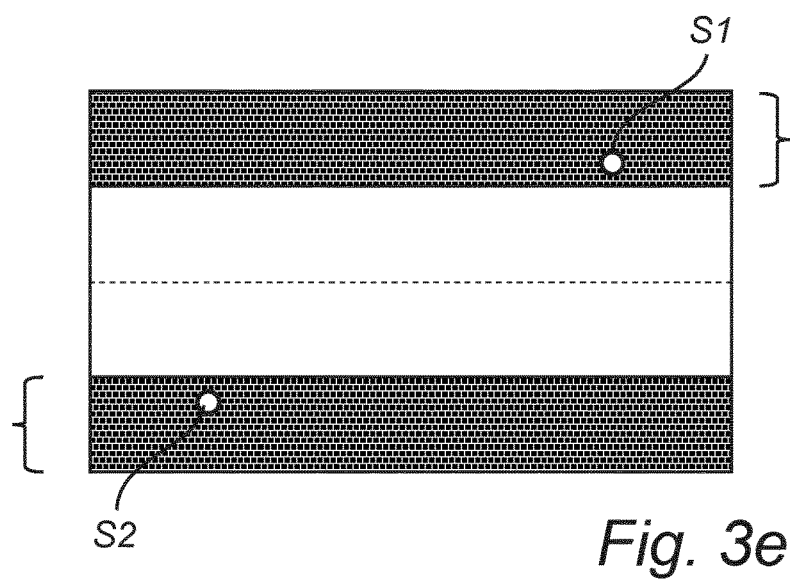
Figure 3F:
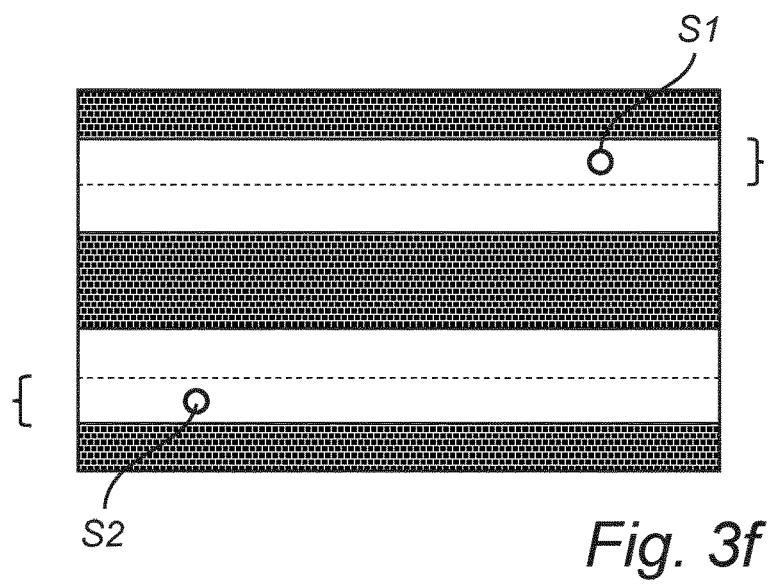
Figure 3G:
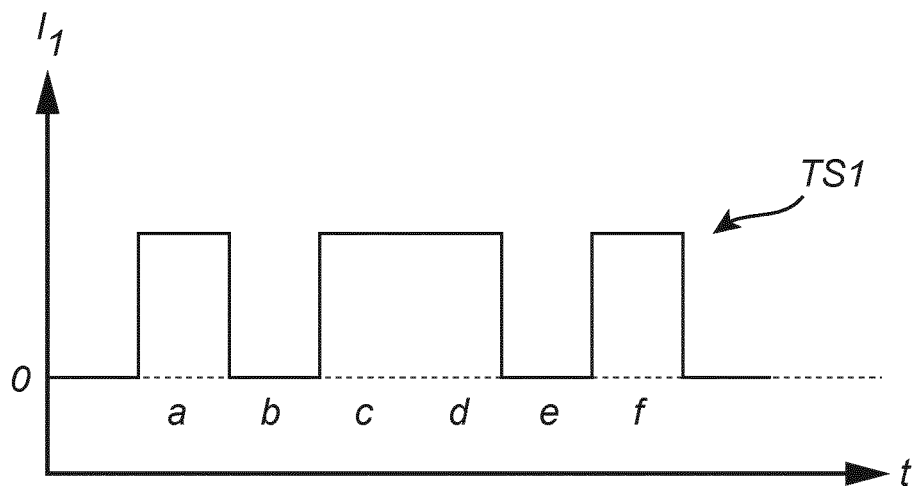
Figure 3H:
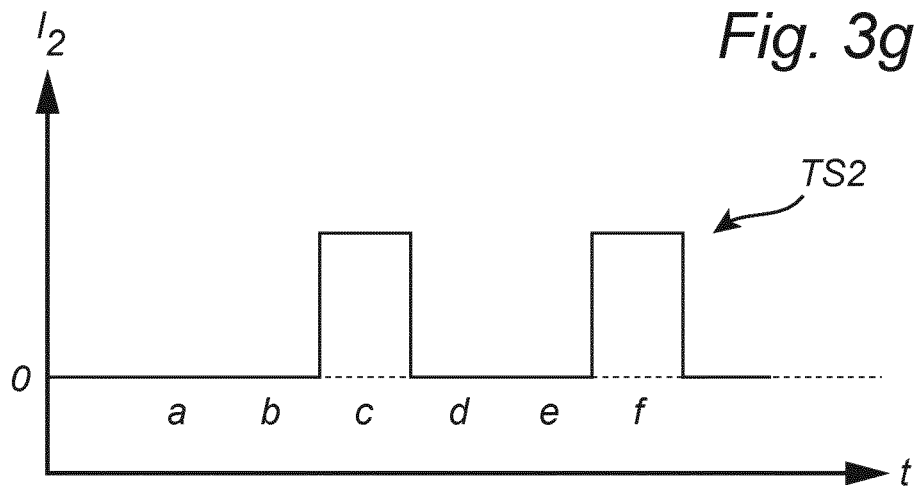
Figure 3I:
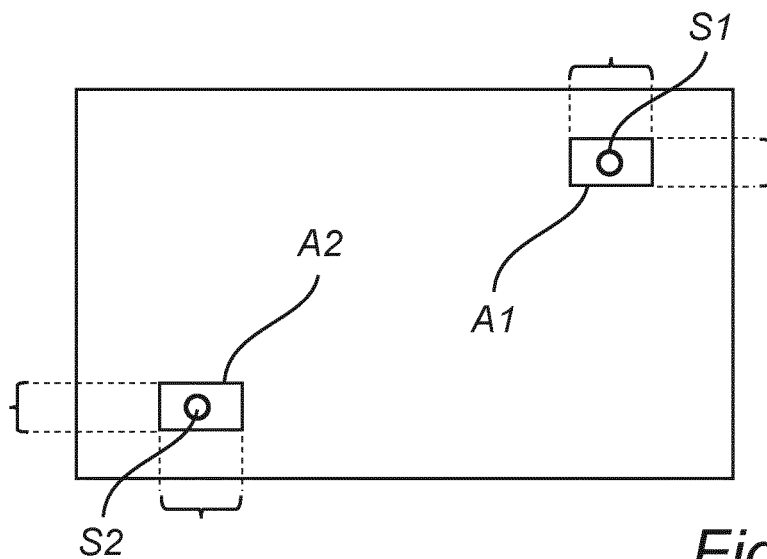

In the following, FIGS. 3a-3i will be referred to as schemes a-i, where schema a refers to FIG. 3a, scheme b to FIG. 3b etc. All six schemes a-f shows the same area of a structural ceiling surface 102 on which the two optical sensors S1 and S2 are arranged. The respective schemes a-f shows the same area of the structural ceiling surface 102 at different points in time where scheme a corresponds to a first point in time and scheme f corresponds to a last point in time of the respective schemes. The sequential illumination of the optical sensors S1, S2 according to the illumination sequence including six different illumination patterns is performed. The six different illumination patterns will result in that each of the optical sensors S1, S2 outputs a temporal signal TS1, TS2 indicative of a level of illumination at the respective schemes a-f. The temporal signals TS1 and TS2 are depicted in the respective graphs g and h in FIG. 3.

The outputted temporal signals TS1 and TS2 may in practice be used to determine in which directions the optical sensors S1, S2 are arranged in relation to the projector 104. In practice, a space angle interval with respect to the projector may be determined for each optical sensor S1, S2. The space angle interval will in practice correspond an angle interval along a first major direction and an angle interval along a second major direction. The space angel intervals of the optical sensors S1, S2 will thus correspond to a respective area A1, A2 at the structural ceiling surface 102. This is illustrated in scheme i in FIG. 3.

In the following it will be described in greater detail how the respective directions to sensors S1, S2 are determined by illuminating different subsets of the sensors S1, S2 in sequence by the projector 104.

Before the first illumination of scheme a is employed a dark level signal with the projector tuned off is preferably recorded as a reference signal.

In the first illumination pattern of scheme a, sensor S1 is illuminated while sensor S2 is not. In other words, sensor S1 is at scheme a located in an area with high illumination intensity while sensor S2 is located in an area with a lower illumination intensity such as a background illumination intensity. At the point in time corresponding to scheme a, sensor S1 will output a signal indicative of a higher level of illumination as compared to sensor S2. This is illustrated in schemes g and h where it may be seen that the temporal signal TS1 of sensor S1 has a higher signal level than the temporal signal TS2 of sensor S2 at point a. In fact, the temporal signal TS2 of sensor S2 is set to a zero since corresponding to a background illumination level.

Form the respective temporal signals TS1, TS2 and the illumination pattern at scheme a, it may be concluded that sensor S1 is located somewhere in the area indicated by the bracket above scheme a. Correspondingly, it may be concluded that sensor S2 is located somewhere in the area indicated by the bracket below scheme a. This because sensor S1 is in the illuminated area at the right of scheme a, while sensor S2 is in the non-illuminated area at the left of scheme a.

Followingly, the sensors S1, S2 are illuminated with a second illumination pattern of scheme b. Sensors S1 and S2 are not illuminated when the second illumination pattern scheme b is employed. In other words, both sensor S1 and sensor S2 are located in an area with a low illumination intensity such as a background illumination intensity. At the point in time corresponding to scheme b, sensors S1 and S2 will output signals indicative of a low level of illumination. This is illustrated in schemes g and h where it may be seen that the temporal signals TS1 and TS2 both have a low signal level at point b.

Form the respective temporal signals TS1, TS2 and the illumination pattern at scheme b, it may be now be concluded that sensor S1 is located somewhere in the area indicated by the bracket above scheme b. Correspondingly, it may be concluded that sensor S2 is located somewhere in the area indicated by the bracket below scheme b.

Followingly, sensors S1, S2 are illuminated with a third illumination pattern of scheme c. Sensors S1 and S2 are illuminated when the third illumination pattern of scheme c is employed. In other words, both sensor S1 and sensor S2 are located in an area which is illuminated by the projector 104. At the point in time corresponding to scheme c, sensors S1 and S2 will output signals indicative of a high level of illumination. This is illustrated in schemes g and h where it may be seen that the temporal signals TS1 and TS2 both have a high signal level at point c.

Form the respective temporal signals TS1, TS2 and the illumination pattern at scheme c, it may be now be concluded that sensor S1 is located somewhere in the area indicated by the bracket above scheme c. Correspondingly, it may be concluded that sensor S2 is located somewhere in the area indicated by the bracket below scheme c.

The three initial illumination patterns are more specifically predetermined dichotomy patterns along a first major direction.

Followingly, a fourth illumination pattern of scheme d is employed. When employing the illumination pattern of scheme d sensor S1 is illuminated while sensor S2 is not. In other words, sensor S1 is at scheme d located in an area with high illumination intensity while sensor S2 is located in an area with a lower illumination intensity such as a background illumination intensity. At the point in time corresponding to scheme d, sensor S1 will output a signal indicative of a higher level of illumination as compared to sensor S2. This is illustrated in schemes g and h where it may be seen that the temporal signal TS1 of sensor S1 has a higher signal level than the temporal signal TS2 of sensor S2 at point d.

Form the respective temporal signals TS1, TS2 and the illumination pattern at scheme d, it may be concluded that sensor S1 is located somewhere in the area indicated by the bracket to the right of scheme d. Correspondingly, it may be concluded that sensor S2 is located somewhere in the area indicated by the bracket to the left of scheme d.

Followingly, the sensors S1, S2 are illuminated with a fifth illumination pattern of scheme e. Sensors S1 and S2 are not illuminated when the fifth illumination pattern scheme e is employed. In other words, both sensor S1 and sensor S2 are located in an area with a low illumination intensity such as a background illumination intensity. At the point in time corresponding to scheme e, sensors S1 and S2 will output signals indicative of a low level of illumination. This is illustrated in schemes g and h where it may be seen that the temporal signals TS1 and TS2 both have a low signal level at point e.

Form the respective temporal signals TS1, TS2 and the illumination pattern at scheme e, it may now be concluded that sensor S1 is located somewhere in the area indicated by the bracket to the right of scheme e. Correspondingly, it may be concluded that sensor S2 is located somewhere in the area indicated by the bracket to the left of scheme e.

Followingly, sensors S1, S2 are illuminated with a sixth illumination pattern of scheme f. Sensors S1 and S2 are illuminated when the sixth illumination pattern of scheme f is employed. In other words, both sensor S1 and sensor S2 are located in an area which is illuminated by the projector 104. At the point in time corresponding to scheme f, sensors S1 and S2 will output signals indicative of a high level of illumination. This is illustrated in schemes g and h where it may be seen that the temporal signals TS1 and TS2 both have a high signal level at point f.

Form the respective temporal signals TS1, TS2 and the illumination pattern at scheme f, it may be now be concluded that sensor S1 is located somewhere in the area indicated by the bracket to the right of scheme f. Correspondingly, it may be concluded that sensor S2 is located somewhere in the area indicated by the bracket to the left of scheme f.

The three final illumination patterns of schemes d-f are more specifically predetermined dichotomy patterns along a second major direction, where the first major direction being perpendicular to the second major direction.

It may be concluded from the temporal signal TS1 of the six above described illumination patterns that the sensor S1 is located in the area A1 of scheme i. Correspondingly, it may be concluded from the temporal signal TS2 of the six above described illumination patterns that the sensor S2 is located in the area A2 of scheme i. In practice, as described above the respective areas A1 and A2 of scheme i corresponds to in which directions the sensors S1, S2 are arranged in relation to the projector 104. In practice, the number of illumination patterns of the above type may be increased so as to more accurate determine the locations of the sensors S1 and S2. In other words, by increasing the number of illumination patterns of the above type the areas A1 and A2 of scheme i may be reduced in size.

As an alternative to predetermined dichotomy patterns, a relatively narrow light cone may scan the structural ceiling surface 102 on which the optical sensors S1 and S2 are attached. It may be then be recorded for what space angle the light cone impinges on the respective sensors S1 and S2.

As an alternative to predetermined dichotomy patterns, a laser beam may scan the structural ceiling surface 102 on which the optical sensors S1 and S2 are attached. It may be then be recorded for what directions the laser beam impinges on the respective sensors S1 and S2.

Other strategies may also be used to advantage for locating the optical sensors S1 and S2 attached to the structural ceiling surface 102.

Now referring back also to FIG. 1 and FIG. 2, as previously indicated, sensor S1 and sensor S2 may correspond to any of the optical sensors 112*a*-112*d* of FIG. 1 or the optical sensors 212*a-f* of FIG. 2. Hence, in a manner corresponding to what has been described above in conjunction to FIG. 3 it may be concluded how the respective optical sensors 112*a*-112*d* (or 212*a-d*) are located relative to the projector 104 in terms of in which directions the sensors 112*a*-112*d* (or 212*a-d*) are arranged in relation to the projector 104.

Based on determined directions of the respective sensors 112*a*-112*d* (or 212*a-d*) and the known distribution pattern an image plane relative to the projector may be now be determined by mathematical calculations. Needless to say, the directions of the respective sensors 112*a*-112*d* (or 212*a-d*) need not be determined. Rather, an image plane relative to the projector 104 may be determined based on the known distribution pattern of the set of optical sensors 112*a*-112*d* (or 212*a-d*) and the outputted temporal signals TS1, TS2 of each of the optical sensors 112*a*-112*d* (or 212*a-d*).

The image plane relative to the projector 104 may be determined using homography algorithms as is known in the art. The main purpose of determining the image plane relative to the projector 104 is to correct the image projected by the projector 104 to fit the plane of the structural ceiling surface 102 or to at least compensate the image projected by the projector 104 to become parallel with the plane of the structural ceiling surface 102.

The image plane relative to the projector 104 may be determined by inverting the homography matrix. In the subject case, the homography matrix includes elements relating to positions of at least four optical sensors 112a-112d (or 212a-d).

For instance, the optical sensors 112a-112d may as depicted in FIG. 1 be positioned at equivalent distances around a centre point. Hence, in FIG. 1 the intersection of the adjustable holder 116 and the common substrate 114 may correspond to the centre point. The centre point may for reasons of simplicity is given the coordinates (0, 0), i.e. the centre point may be considered to be located at the origin of a coordinate system having an X-axis and a Y-axis. The respective optical sensors 112a-112d may for reasons of simplicity be given the coordinates (1, 1), (−1, 1), (1, −1) and (−1, −1). That is, each optical sensor may be considered located one distance or length unit away from the centre point in each one of the X-direction and the Y-direction. All optical sensors 112a-112d depicted in FIG. 1 are located in different directions with respect to the centre point which is reflected in the signs of the respective coordinates of the optical sensors 112a-112d.

Hence, using the outputted temporal signals TS1, TS2 of each of the optical sensors 112a-112d, the position of each optical sensor of the optical sensors 112a-112d in view of the projector 104 may be determined. The positions of each of the optical sensors 112a-112d in the view of the projector may be denoted coordinates $(X_1, Y_1)$, $(X_2, Y_2)$, $(X_3, Y_3)$ and $(X_4, Y_4)$.

Now considering the eight points (1, 1), (−1, 1), (1, −1), (−1, −1), $(X_1, Y_1)$, $(X_2, Y_2)$, $(X_3, Y_3)$ and $(X_4, Y_4)$ which may be included in a 3×3 homography matrix.

The homography matrix including the eight points may now be inverted in order to determine the image plane relative to the projector 104.

More specifically, the inverted homography matrix will result in a transform matrix or projective transform which when applied, to e.g. an image, will place the point $(X_1, Y_1)$ in the point (1, 1), the point $(X_2, Y_2)$ in the point (−1, 1), the point $(X_3, Y_3)$ in the point (1, −1) and the point $(X_4, Y_4)$ in the point (−1, −1). The projective transform will consequently include translation, rotation and scale.

The inversion of the homography matrix may for instance be calculated using the tool OpenCV which is a programming library mainly aimed at computer vison.

Since a projective transform have 8 degrees of freedom the locations of at least four optical sensors 112a-112d (or 212a-d) need to be determined in relation to the projector 104. The projective transform has 8 degrees of freedom for 9 coefficients (3×3 matrix). However, because such transforms are defined within a scaling factor, which removes one degree of freedom, one of the coefficients can be arbitrarily set to 1.

After having determined the image plane relative to the projector 104, the projector may display an image indicative of installation locations 120 of primary profiles at the image plane, as is shown in FIG. 4.

More specifically, the user device 110 may determine the image plane relative to the projector 104 based on the known distribution pattern of the set of optical sensors 112a-112d (or 212a-d) and the outputted temporal signals TS1, TS2 of each of the optical sensors 112a-112d (or 212a-d). This may typically be determined by mathematical calculations performed in the user device 110, e.g. according to the above example. The user device 110 may thus transmit a signal to the image source 108. The signal may thus be constituted such that the displayed image of the projector 104 based on the image signal form the image source 108 is displayed at the determined image plane.

In FIG. 4, it is illustrated how an image 122 is displayed at the structural ceiling surface 102 of the room 100. Hence, the structural ceiling surface 102 corresponds to the determined image plane. The image 122 includes installation locations 120 of primary profiles of the grid of profiles. In FIG. 4 it is depicted how installation locations 120 of five primary profiles are indicated as straight parallel lines displayed on the structural ceiling surface 102 of the room 100.

The optical sensors 112a-d have been removed in FIG. 4 but may very well be present at the time of displaying the image 122.

The displayed image 122 comprises displayed fix points 124 of the primary profiles to be installed. The fixpoints 124 may be indicated with image features such as dots or crosses at locations where it is appropriate to fix the primary profiles to be installed. The displayed fixpoints 124 may consequently be displayed at certain distances where a firm installation of the primary profiles will be achieved while not using an excessive amount of fix points 124.

Hence, in the situation depicted in FIG. 4 the image plane has been determined such that the image plane substantially includes physical locations of the optical sensors 112a-112d (or 212a-d) of the set of optical sensors. Moreover, the image 122 displayed by the projector 104 is displayed on the structural ceiling surface 102. For this reason, a projective transform has been calculated based on a location of the projector 104 relative to the image plane. The projective transform may advantageously be calculated by the user device 110. The projective transform has been applied to the displayed image 122 depicted in FIG. 4. By applying the projective transform the displayed image 122 may be compensated for size and wrap with respect to the image plane and consequently to the structural ceiling surface 102 of the room 100. In other words, the projective transform may be applied such that the image 122 is correctly displayed on the structural ceiling surface 102, i.e. the displayed image 122 indicative of installation locations 120 of the primary profiles corresponds to actual and desired installation locations of the primary profiles to be installed.

More specifically, the projective transform may be determined by inverting the homography matrix as described above.

Also, the rotation of the projector 104 relative to a desired direction of the installation locations 120 of primary profiles at the image plane may be determined. The rotation may be determined by mathematical calculations based on the known distribution pattern of the set of optical sensors 112a-112c (or 212a-d) and the outputted temporal signals TS1, TS2 of each of the optical sensors 112a-112c (or 212a-d). The rotation may be calculated by the user device 110 and may consequently be transmitted to the image source 108 such that the rotation of the displayed image 122 is compensated based on the determined rotation.

More specifically, the rotation of the projector 104 relative to a desired direction of the installation locations 120 of primary profiles at the image plane may be determined from the projective transform resulting from inversion of the homography matrix as described above.

The position of the displayed image 122 of FIG. 4 may be adjusted based on building information model data, BIM data. By adjusting the position of the displayed image 122 based on BIM data the image 122 including the installation locations 120 of primary profiles at the image plane, i.e. at the structural ceiling surface 102, may be adjusted sideways such that the installation locations 120 of primary profiles at the image plane are aligned with certain building features, such as walls or air outlets. Correspondingly, the position of the image 122 may be adjusted such that installation locations 120 of the primary profiles are positioned at locations where there is a reduced risk of interfering with or damaging concealed features of the building, such as piping or electrical cables. In order to achieve this, the user device 110 may include BIM data stored therein or the user device 110 may receive BIM data from a remote resource such as a server or a cloud service. The user device 110, may thus based on the BIM data adjust the signal transmitted to the image source 108 such that the position of the displayed image 122 is adjusted sideways as desired.

The position of the displayed image 122 of FIG. 4 may be adjusted based on a user-initiated input signal. Hence, a user may typically adjust the position of the displayed image 122 by an input on the user device 110. The user device 110 may in response to the user input adjust the signal transmitted to the image source 108 such that the position of the displayed image 122 including the installation locations 120 of primary profiles at the image plane, i.e. at the structural ceiling surface 102, is adjusted sideways as desired. By doing this, a user may adjust the position of the mage 122 such that installation locations 120 of primary profiles at the image plane are aligned with certain building features, such as walls or air outlets. Correspondingly, the position of the image 122 may be adjusted such that installation locations 120 of the primary profiles are positioned at locations where there is a reduced risk of interfering with or damaging concealed features of the building, such as piping or electrical cables.

Correspondingly, a rotation of the displayed image 122 of FIG. 4 may be adjusted based on a user-initiated input signal.

The optical sensors 112a-112c (or 212a-d) may be arranged at locations corresponding to junctions of the grid of profiles to be installed. By this, a user may get an instant and visual confirmation that the image 122 is displayed correctly, i.e. a user may verify that the sensors 112a-112c (or 212a-d) actually are aligned at locations corresponding to junctions of the grid of profiles in the displayed image 122.

Figure 5:
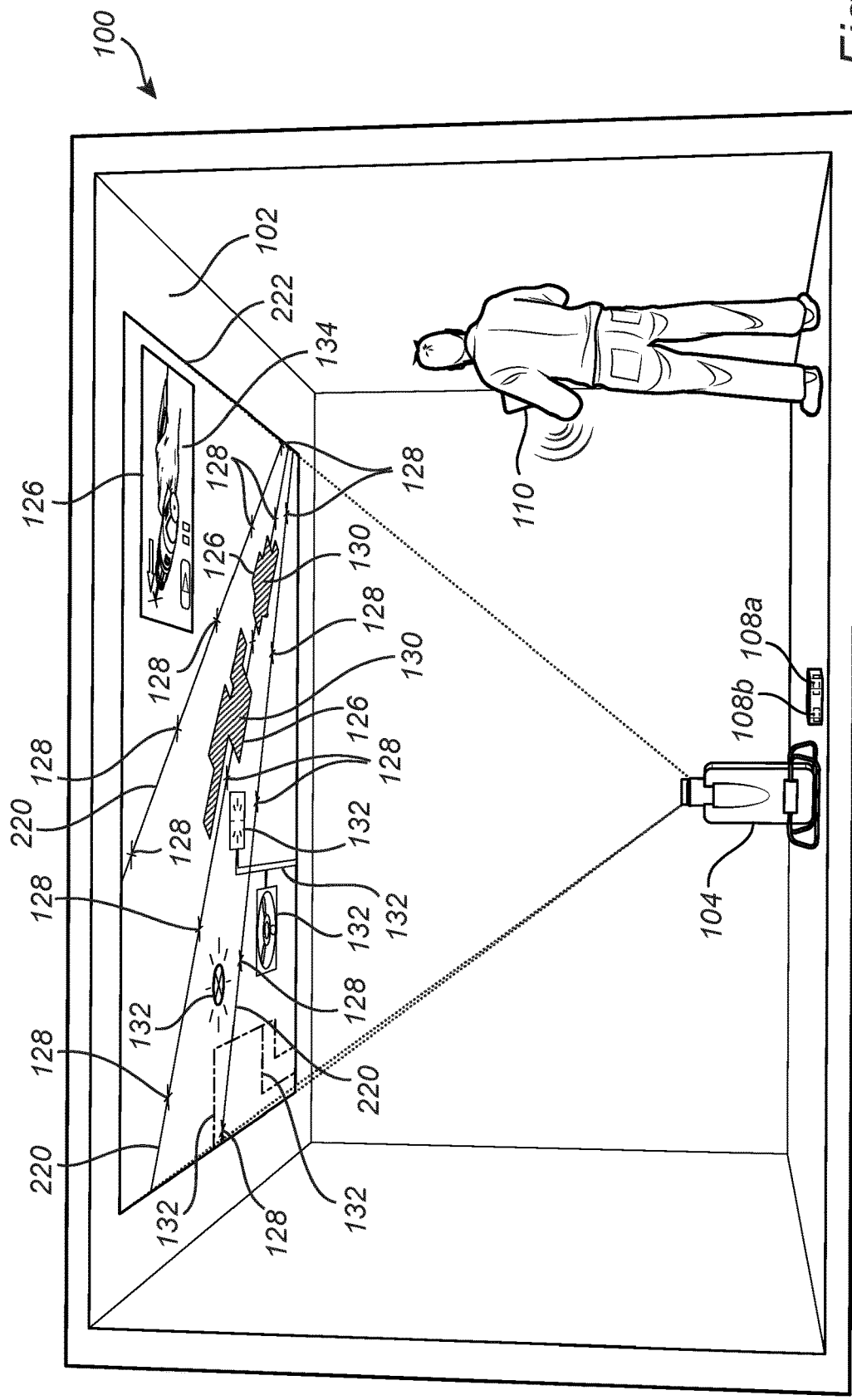
FIG. 5 conceptually illustrates the room of FIG. 1 while displaying additional information on a structural ceiling surface.

Now referring to FIG. 5, here room 100 is depicted with a different image 222 displayed at the structural ceiling surface 102. In order to avoid undue repetition, only differences in relation to FIG. 4 will be discussed below.

As can be seen in FIG. 5, installation locations 220 of primary profiles to be installed are shown in the image 222. The installation locations 220 of the of primary profiles to be installed are shown as straight lines extending at oblique angles with respect to each other. Hence, the installation locations 220 of the of primary profiles to be installed are shown as non-parallel lines in the image 222.

The image 222 includes more information as compared to the image 122 of FIG. 4. The depicted image 222 of FIG. 5 includes installation guidance 126 based on BIM data. The installation guidance 126 is thus displayed as a part of the image 222. The included installation guidance 126 is based on BIM data in the sense that the displayed installation guidance 126 is displayed in manner where features of the building is taken into account. The displayed installation guidance 126 may for instance take concealed features of the building into account. Not yet installed features of the building may be taken into account such that sufficient space is left for the features to be installed later on. The displayed installation guidance 126 may thus be positioned in areas which are suitable for installation of the primary profiles to be installed.

The displayed image 122 may include may include fix points 128 of primary profiles to be installed. The fix points 128 may thus be displayed at suitable locations where there is a reduced risk of interfering with or damaging concealed features of the building. The fixpoints 128 may be indicated with image features such as dots or crosses at locations where it is appropriate to fix the primary profiles to be installed. The displayed fixpoints 128 may consequently be displayed at certain distances where a firm installation of the primary profiles will be achieved while not using an excessive amount of fix points 128. The displayed fix points 128 is an example of displayed installation guidance 126.

The displayed image 122 may include forbidden areas 130 for fix points 128 of primary profiles to be installed. The forbidden areas 130 may be displayed in areas where fix points 128 would risk interfering with or damaging concealed features of the building, such as piping or electrical cables. The forbidden areas 130 may be displayed in areas where fix points 128 would risk interfering with features of the building that has not yet been installed. The displayed forbidden areas 130 is an example of displayed installation guidance 126.

The displayed image 122 may include building information model data, BIM data 132. The displayed image 122 may consequently visualise concealed features 132 of the building, such as piping or electrical cables. The displayed image 122 may consequently visualise features 132 of the building that has not yet been installed. The image 122 may as a few non-limiting examples include visual representations 132 of cables, pipes, wires, airducts, air outlets, lighting appliances, heaters, smoke detectors, fans, wi-fi access points, sprinklers, interior walls and windows.

The displayed installation guidance 126 may as a further example include a movie clip 134 showing an installation scheme how a typical primary profile is installed at the structural ceiling 102 of the room 100. The movie clip 134, may include indications on where to fix the primary profiles to be installed. That is the movie clip 134 may include information regarding fix points 128 of the primary profiles to be installed. The movie clip 134 may also include information regarding suitable ways of drilling in the structural ceiling 102, as well as which type of fasteners to suitably use for the structural ceiling 102 at hand. Hence, different drilling techniques and fasteners may be displayed based on the material of the structural ceiling 102 at hand. Information regarding the material of the structural ceiling 102 at hand may for instance be gathered by the user device 110 form a server having BIM data stored thereon.

Figure 6:
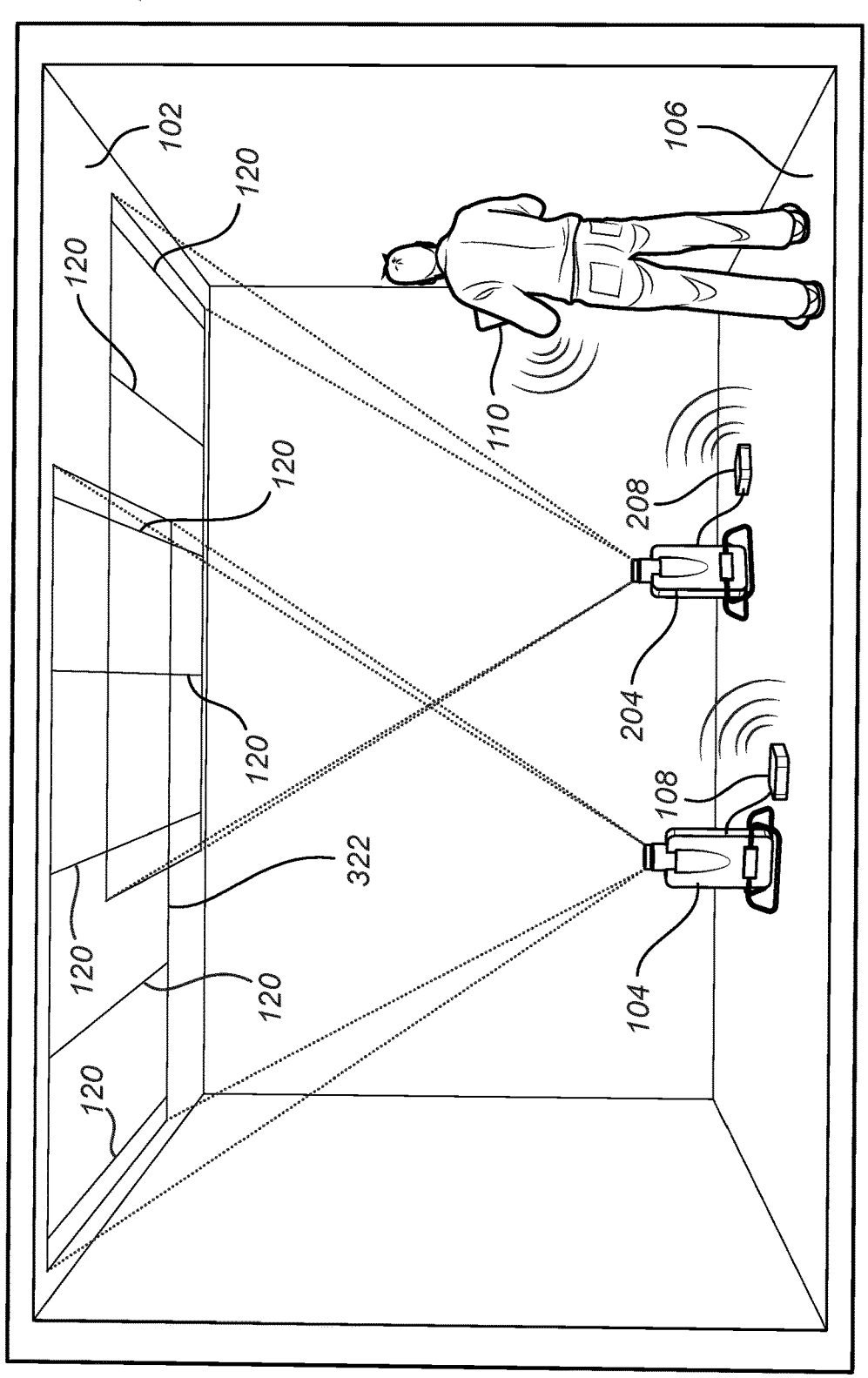
FIG. 6 conceptually illustrates the room of FIG. 1 while using a second projector in addition to the projector.

Now referring to FIG. 6, here room 100 is depicted with two different projectors 104, 204 used to display an image 322 at the structural ceiling surface 102. In order to avoid undue repetition, only differences in relation to FIG. 4 will be discussed below.

As is illustrated in FIG. 6, a second projector 204 is arranged on the floor 106 of the room 100 in addition to the projector 104. The second projector 204 is like the projector 104 arranged at a distance from the structural ceiling surface 102. The image 322 is displayed at the image plane by the projector 104 and the second projector 204. The image 322 is jointly formed by the projector 104 and the second projector 204. The image source 108 connected to the projector and the image source 208 connected to the second projector 204 are both connected to the user device 110. The user device 110 may thus distribute image data to the image source 108 and the image source 208 such that the image 322 is jointly formed by the projector 104 and the second projector 204. Before, the image 322 may be displayed by the projector 104 and the second projector 204, a common image plane is determined for each one of the projector 104 and the second projector 204 as described above.

In the depicted setup of FIG. 6, the image plane coincides with the structural ceiling surface 102. Hence, the image 322 is displayed at the structural ceiling surface 102. The image 322 includes installation locations 120 of primary profiles. The installation locations 120 are depicted as straight lines extending in parallel. However, different layouts of the installation locations 120 may be used to advantage when using a second projector 204 in addition to the projector 104. Also, information of the kind described in conjunction with FIG. 5 may be displayed in image 322. By utilising the projector 104 and the second projector 204 a larger installation area may be covered by the image 322 at the same time. Moreover, an increased redundancy may be achieved in case of failure of the projector 104 or the second projector 204. Furthermore, the risk of certain areas of the structural ceiling surface 102 being shadowed, by for instance pillars, light armatures, inner walls or similar, may also be reduced.

Figure 7:
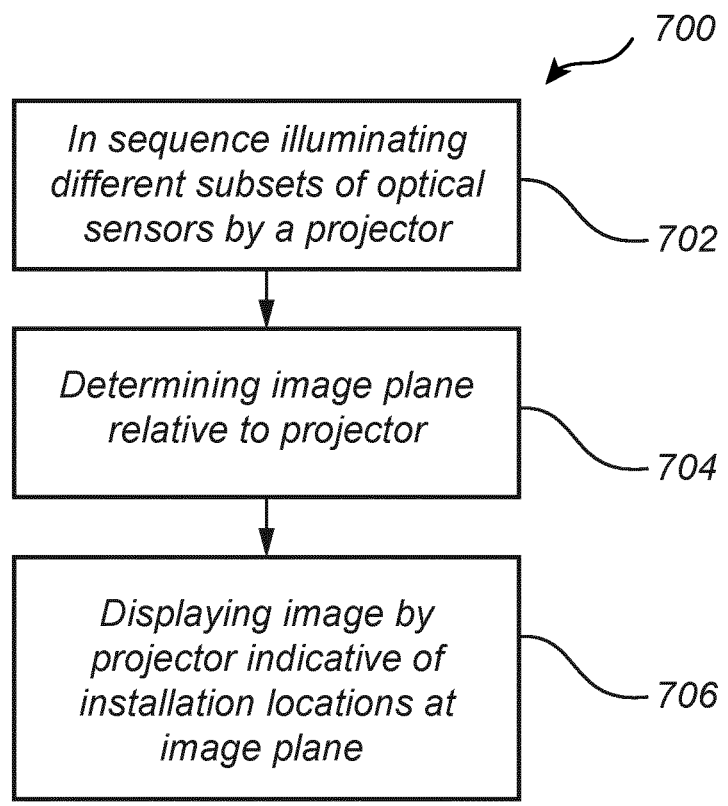
FIG. 7 is a flowchart of a method for installation of a ceiling system attached to a structural ceiling surface.

Now referring to FIG. 7 in addition to FIGS. 1-6. In FIG. 7 is shown a flow scheme of a method 700 which may be used for installation of a grid of profiles of a ceiling system attached to a structural ceiling surface 102 as have been described above in conjunction with FIGS. 1-6. The method 700 comprising; in sequence illuminating 702, by a projector 104, different sub sets of a set of optical sensors 112a-d, 212a-d, S1, S2 separately arranged in a known distribution pattern on the structural ceiling surface 102, wherein each optical sensor 112a-c, 212a-c, S1, S2 of the set of optical sensors being arranged to output a temporal signal TS1, TS2 indicative of a level of illumination, determining 704 an image plane relative to the projector 104 based on the known distribution pattern of the set of optical sensors 112a-c, 212a-c, S1, S2 and the outputted temporal signals TS1, TS2 of each of the optical sensors 112a-d, 212a-d, S1, S2, displaying 706, by the projector 104, an image 122, 222, 322 indicative of installation locations 120, 220 of the primary profiles at the image plane.

As is understood, the respective features and elements described in conjunction with the respective FIGS. 1-7 may be combined or interchanged to suit specific installation needs, when installing a grid of profiles for a ceiling system.

Moreover, it will be appreciated that the concept of displaying an image indicative of installation locations at an image plane may advantageously be used in the course of installing other entities than primary profiles of a grid of profiles for a ceiling system.

For instance, installation locations of ceiling tiles installed independently, i.e. without a grid of profiles, may be displayed to advantage a determined image plane.

Moreover, installation locations of sound absorbing baffles, such as ceiling or wall mounted baffles may advantageously be displayed a determined image plane.

Also, installation locations of other devices, such as fans, lightings, loudspeakers, sprinklers, wi-fi transceivers and air inlets may be displayed to advantage at a determined image plane.

It will be appreciated that the present inventive concept is not limited to the variants shown. Several modifications and variations are thus conceivable within the scope of the invention which thus is exclusively defined by the appended claims.

The invention claimed is:

1. A method for installation of a ceiling system attached to a structural ceiling surface, the method comprising:
   illuminating, in sequence and by a projector, different subsets of a set of optical sensors separately arranged in a known distribution pattern on the structural ceiling surface, wherein each optical sensor of the set of optical sensors being arranged to output a temporal signal indicative of a level of illumination,
   determining an image plane relative to the projector based on the known distribution pattern of the set of optical sensors and the outputted temporal signals of each of the optical sensors, and
   displaying, by the projector, an image indicative of installation locations of the ceiling system at the image plane.

2. The method according to claim 1, wherein the ceiling system comprises a grid of profiles comprising a plurality of primary profiles, and
   wherein the displaying the image comprises displaying information indicative of installation locations of the primary profiles at the image plane.

3. The method according to claim 1, wherein the determining the image plane comprises determining the image plane such that the image plane includes physical locations of the optical sensors of the set of optical sensors.

4. The method according to claim 1, wherein the displaying the image comprises displaying the image on the structural ceiling surface.

5. The method according to claim 4, wherein the displaying the image comprises calculating a projective transform based on a location of the projector relative to the image plane, and
   applying the projective transform to the image such that the displayed image is compensated for size and wrap with respect to the structural ceiling surface.

6. The method according to claim 1, wherein the determining the image plane comprises determining a rotation of the projector relative to a desired direction of the installation locations of the ceiling system at the image plane based on the known distribution pattern of the set of optical sensors and the outputted temporal signals of each of the optical sensors, and
   wherein the displaying the image comprises compensating a rotation of the image based on the determined rotation.

7. The method according to claim 1, wherein the displaying the image comprises adjusting a position of the image at the image plane based on building information model (BIM) data.

8. The method according to claim 1, wherein the displaying the image comprises adjusting a position of the image at the image plane based on a user-initiated input signal.

9. The method according to claim 2, wherein the optical sensors of the set of optical sensors are arranged at locations corresponding to junctions of the grid of profiles.

10. The method according to claim 1, wherein the optical sensors of the set of optical sensors are arranged on a common substrate which is adapted to be arranged at the structural ceiling surface.

11. The method according to claim 1, wherein the displaying the image comprises displaying installation guidance based on building information model (BIM) data.

12. The method according to claim 11, wherein the displaying the image comprises displaying fix points of the ceiling system to be installed.

13. The method according to claim 11, wherein the displaying the image comprises displaying forbidden areas for fix points of the ceiling system to be installed.

14. The method according to claim 11, wherein the displaying the image comprises displaying fix points of primary profiles to be installed.

15. The method according to claim 11, wherein the displaying the image comprises displaying forbidden areas for fix points of primary profiles to be installed.

16. The method according to claim 1, wherein the displaying the image further comprises displaying building information model (BIM) data.

17. The method according to claim 1, wherein the illuminating different subsets of the set of optical sensors comprises:
- illuminating, in sequence, different subsets of the set of optical sensors according to a first predetermined dichotomy pattern along a first major direction, and
- illuminating, in sequence, different subsets of the set of optical sensors according to a second predetermined dichotomy pattern along a second major direction, the first major direction being perpendicular to the second major direction.

18. The method according to claim 1, further comprising:
- arranging a second projector, separate from the projector, at a distance from the structural ceiling surface, and
- displaying, by the projector and the second projector, the image indicative of installation locations of the ceiling system at the image plane.

* * * * *